United States Patent
Lee

(10) Patent No.: US 8,031,535 B2
(45) Date of Patent: Oct. 4, 2011

(54) SEMICONDUCTOR MEMORY APPARATUS

(75) Inventor: Geun-Il Lee, Ichon (KR)

(73) Assignee: Hynix Semiconductor Inc. (KR)

( * ) Notice: Subject to any disclaimer, the term of this patent is extended or adjusted under 35 U.S.C. 154(b) by 296 days.

(21) Appl. No.: 12/345,205

(22) Filed: Dec. 29, 2008

(65) Prior Publication Data

US 2009/0257285 A1    Oct. 15, 2009

(30) Foreign Application Priority Data

Apr. 10, 2008  (KR) .......................... 10-2008-0033318

(51) Int. Cl.
*G11C 7/10* (2006.01)
(52) U.S. Cl. ............... 365/189.05; 365/189.07; 365/193
(58) Field of Classification Search ............. 365/189.05, 365/189.07, 193
See application file for complete search history.

(56) References Cited

U.S. PATENT DOCUMENTS

| | | | |
|---|---|---|---|
| 5,278,803 A * | 1/1994 | Wanner | 365/233.11 |
| 6,408,414 B1 | 6/2002 | Hatada | |
| 6,470,467 B2 * | 10/2002 | Tomishima et al. | 714/744 |
| 7,057,946 B2 | 6/2006 | Fukuda | |
| 2006/0220672 A1 | 10/2006 | Sato | |

FOREIGN PATENT DOCUMENTS

| | | |
|---|---|---|
| KR | 1020000000990 A | 1/2000 |
| KR | 1020070040745 | 4/2007 |
| KR | 1020070117855 A | 12/2007 |

* cited by examiner

*Primary Examiner* — Son Dinh
*Assistant Examiner* — Nam Nguyen
(74) *Attorney, Agent, or Firm* — Baker & McKenzie LLP

(57) ABSTRACT

A semiconductor memory apparatus includes an input buffering block configured to buffer an input signal transmitted from an input pin, a latch block configured to latch the input signal buffered by the input buffering block, a defect discriminating block configured to discriminate whether or not the input signal latched by the latch block is defective signal in response to a test mode signal, and a data output buffer configured to buffer an output signal of the defect discriminating block to transmit it to a data output pin, wherein the input signal is one of an input command signal and an input address signal.

18 Claims, 5 Drawing Sheets

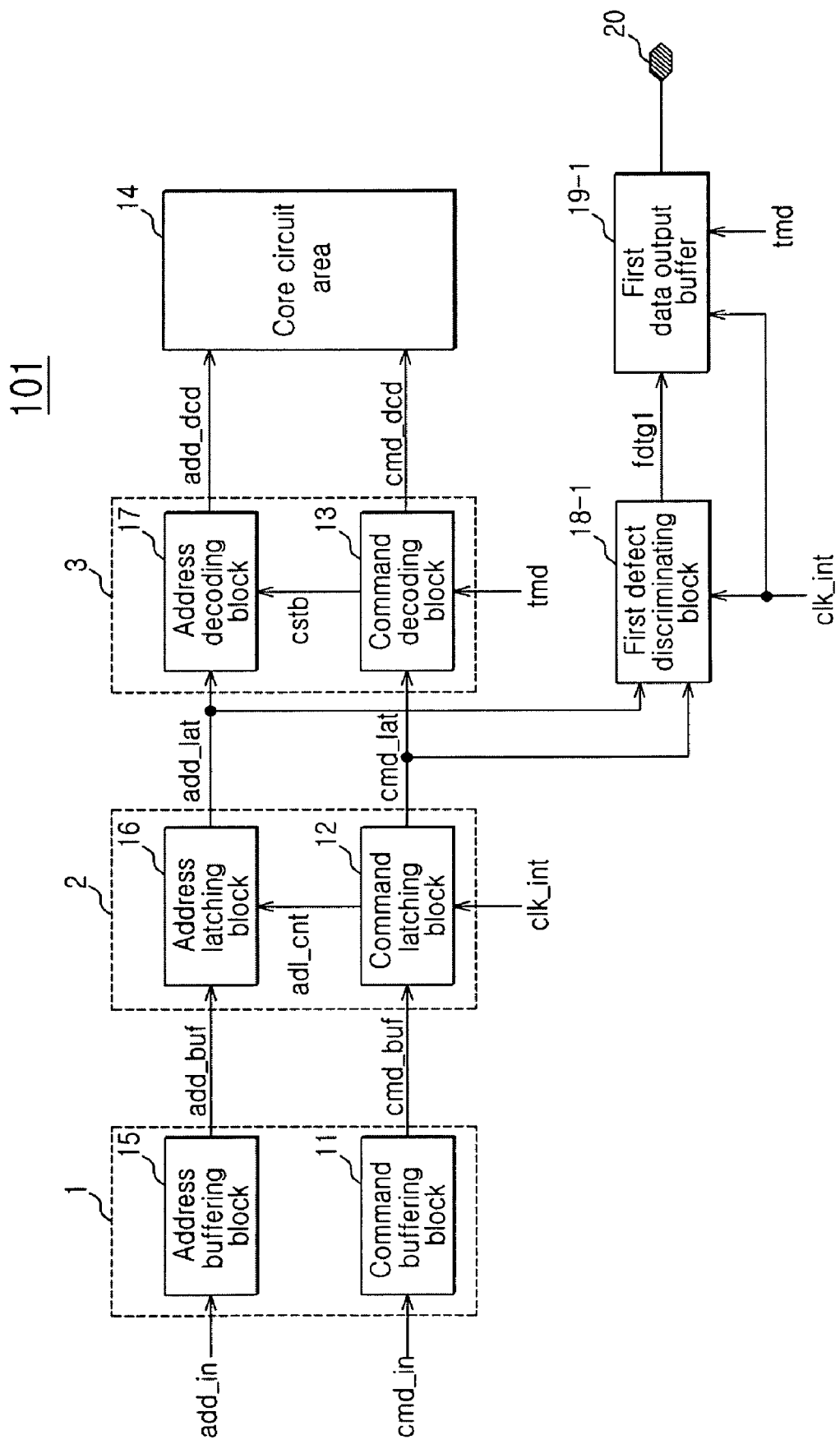

SEMICONDUCTOR MEMORY APPARATUS

CROSS-REFERENCES TO RELATED PATENT APPLICATION

The present application claims the benefit under 35 U.S.C 119(a) to Korean Application No. 10-2008-0033318, filed on Apr. 10, 2008, in the Korean Intellectual Property Office, which is incorporated herein by reference in its entirety as if set forth in full.

BACKGROUND

1. Technical Field

The embodiments described herein relate to a semiconductor memory apparatus, more particularly, to a circuit for testing command or address input in a semiconductor memory apparatus.

2. Related Art

Generally, a semiconductor memory apparatus utilizes boundary scan tests as a data input test for determining a pin and an input buffer that receive data. A plurality of input data is input in one bit unit through the input pin, and then buffered and latched to be transmitted to the inside of the semiconductor memory apparatus. Accordingly, the boundary scan test is utilized to determine whether or not the data has been precisely transmitted up to a latching step.

The semiconductor memory apparatus also utilizes a compress test mode to test the input data and shorten the time required for the test by simultaneously testing a plurality of data bits through a compress test. This method of testing the input data is commonly utilized to determine whether or not an input pin of a data input circuit or a latch circuit is defective since a result of the test can be verified through a data input/output buffer.

However, technical problems exist when the method of testing the input data is applied to an input test of an input signal, such as a command signal or an address signal. Since a pin for verifying a result of the input test is required for the input test of the input signal, a test pin is added in a wafer state, thereby decreasing the yield of a wafer. Even though the test pin was necessary in order to perform a test for the input pin of the input signal or the latch circuit in the wafer state, it is difficulty to easily test the input signal due to the decreased yield. For example, the input circuit of the input signal does not easily provide improved reliability, thereby lowering the productivity of the semiconductor memory apparatus.

SUMMARY

A semiconductor memory apparatus capable of testing an input signal is described herein.

In one aspect, a semiconductor memory apparatus includes an input buffering block configured to buffer an input signal transmitted from an input pin; a latch block configured to latch the input signal buffered by the input buffering block; a defect discriminating block configured to discriminate whether or not the input signal latched by the latch block is defective signal in response to a test mode signal; and a data output buffer configured to buffer an output signal of the defect discriminating block to transmit it to a data output pin, wherein the input signal is one of an input command signal and an input address signal.

In another aspect, a semiconductor memory apparatus includes a first defect discriminating block configured to discriminate whether or not a command signal transmitted from a first input pin and latched is defective to generate a first defect discriminating signal in response to a test mode signal; a first data output buffer configured to buffer the first defect discriminating signal to transmit the buffered first defect discriminating signal to a first data output pin; a decoding block configured to generate a decoded command signal and a decoded address signal by decoding the latched command signal and an address signal transmitted from a second input pin and latched, to control output of the decoded command signal and the decoded address signal to a core circuit area in response to the test mode signal; a second defect discriminating block configured to discriminate whether or not the decoded address signal is defective to generate a second defect discriminating block signal; and a second data output buffer configured to buffer the second defect discriminating signal to transmit the buffered second defect discriminating signal to a second data output pin.

In another aspect, a semiconductor memory apparatus includes a command decoding block configured to generate a decoded command signal and a command strobe signal by using a command signal transmitted from a first input pin and latched in response to a test mode signal; an address decoding block configured to generate a decoded address signal by using an address signal transmitted from a second input pin and latched in response to the command strobe signal; a defect discriminating block configured to discriminate whether or not the decoded address signal is defective to generate a defect discriminating signal in response to the test mode signal; and a data output buffer configured to buffer the defect discriminating signal to transmit the buffered defect discriminating signal to a data output pin.

These and other features, aspects, and embodiments are described below in the section "Detailed Description."

BRIEF DESCRIPTION OF THE DRAWINGS

FIG. 5 is a schematic diagram of an exemplary configuration of a semiconductor memory apparatus according to another embodiment.

DETAILED DESCRIPTION

Figure 1:
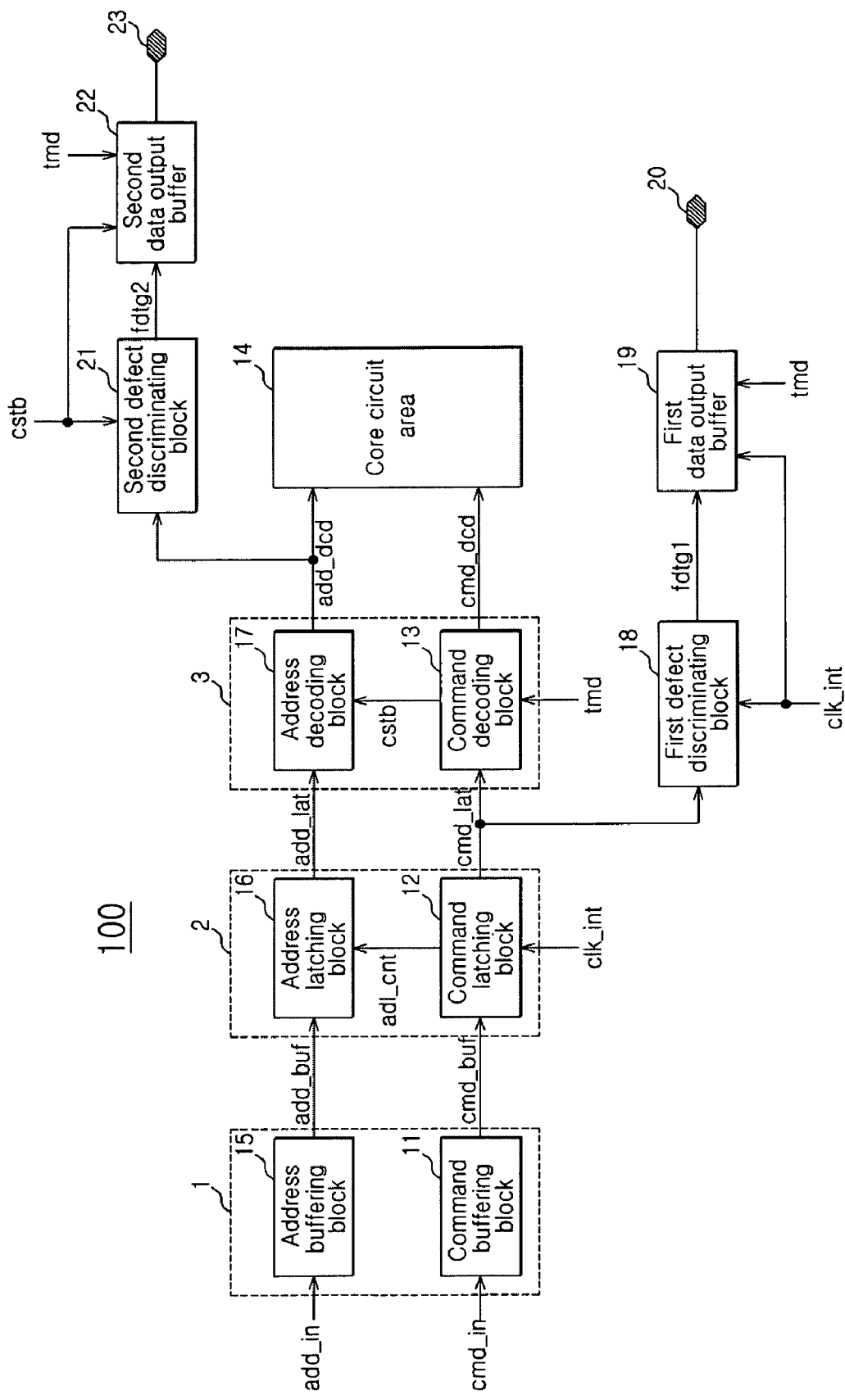
FIG. 1 is a schematic block diagram of an exemplary semiconductor memory apparatus according to one embodiment.

FIG. 1 is a schematic block diagram of an exemplary semiconductor memory apparatus according to one embodiment. In FIG. 1, a semiconductor memory apparatus 100 can be configured to include a command buffering block 11, a command latching block 12, and a command decoding block 13.

The command buffering block 11 can output a buffering command signal 'cmd_buf' by buffering an input command signal 'cmd_in' transmitted from an input pin. The command latching block 12 can output a latch command signal 'cmd_lat' and an address latch control signal 'adl_cnt' by latching the buffering command signal 'cmd_buf' in response to an internal clock signal 'clk_int'. The command decoding block 13 can generate a decoded command signal 'cmd_dcd' and a command strobe signal 'cstb' by decoding the latch command signal 'cmd_lat' and can control output of the decoded command signal 'cmd_dcd' to a core circuit area 14 in response to a test mode signal 'tmd'.

The semiconductor memory apparatus 100 can further include an address buffering block 15, an address latching block 16, and an address decoding block 17. The address buffering block 15 can output a buffering address signal 'add_buf' by buffering an input address signal 'add_in' transmitted from the input pin. The address latching block 16 can output a latch address signal 'add_lat' by latching the buffering address signal 'add_buf' in response to the address latch control signal 'adl_cnt'. The address decoding block 17 can generate a decoded address signal 'add_dcd' by decoding the latch address signal 'add_lat' to output the decoded address signal 'add_dcd' to the core circuit area 14.

In addition, the semiconductor memory apparatus can include a first defect discriminating block 18, a first data output buffer 19, a second defect discriminating block 21, and a second data output buffer 22. The first defect discriminating block 18 can output a first defect discriminating signal 'fdtg1' by discriminating whether or not bits belonging to the latch command signal 'cmd_lat' are defective in response to the internal clock signal 'clk_int'. The first data output buffer 19 can buffer the first defect discriminating signal 'fdtg1' in response to the test mode signal 'tmd' and the internal clock signal 'clk_int' to output the buffered first defect discriminating signal 'fdtg1' to a first data output pin 20. The second defect discriminating block 21 can output a second defect discriminating signal 'fdtg2' by discriminating whether or not bits belonging to the decoded address signal 'add_dcd' are defective in response to the command strobe signal 'cstb'. The second data output buffer 22 can buffer the second defect discriminating signal 'fdtg2' in response to the test mode signal 'tmd' and the command strobe signal 'cstb' to output the buffered second defect discriminating signal 'fdtg2' to a second data output pin 23.

Herein, the internal clock signal 'clk_int' can be a clock signal generated from a clock generating apparatus, such as a Delay Locked Loop (DLL) circuit and can be utilized inside of the semiconductor memory apparatus. Each of the input command signal 'cmd_in' and the input address signal 'add_in' can include a plurality of bits. Thus, the buffer command signal 'cmd_buf', the latch command signal 'cmd_lat', the buffering address signal 'add_buf', and the latch address add_lat can also be implemented by plural bits of signals. The test mode signal 'tmd' can be a signal enabled to test whether or not the input command signal 'cmd_in' and the input address signal 'add_in' are normally latched to the command latching block 12 and the address latching block 16. When the test mode signal 'tmd' is enabled, the plural bits of the input command signal 'cmd_in' and the plural bits of the input address signal 'add_in' can be input at a first logic level, i.e., a high level.

The command buffering block 11 and the address buffering block 15 can constitute an input buffering block 1. That is, the input buffering block 1 can buffer input signals, such as the input command signal 'cmd_in' and the input address signal 'add_in', transmitted from the input pin.

The command latching block 12 and the address latching block 16 can constitute a latch block 2. The latch block 2 can latch the buffering command signal 'cmd_buf' and the buffering address signal 'add_buf' buffered in the buffering block 1.

The command decoding block 13 and the address decoding block 17 can constitute a decoding block 3. That is, the decoding block 3 can generate the decoded command signal 'cmd_dcd' and the decoded address signal 'add_dcd' by decoding the latch command signal 'cmd_lat' and the latch address signal 'add_lat'. In addition, the decoding block 3 can control output of the decoded command signal 'cmd_dcd' and the decoded address signal 'add_dcd' to the core circuit area 14 in response to the test mode signal 'tmd'.

The command decoding block 13 can generate the decoded command signal 'cmd_dcd' and the command strobe signal 'cstb' by decoding the latch command signal 'cmd_lat'. The command decoding block 13 can transmit the generated decoded command signal 'cmd_dcd' to the core circuit area 14 and the command strobe signal 'cstb' to the address decoding block 17 when the test mode signal 'tmd' is disabled. The command decoding block 13 can block output of the decoded command signal 'cmd_dcd' when the test mode signal 'tmd' is enabled.

The first defect discriminating block 18 can discriminate whether or not the latch command signal 'cmd_lat' is defective and can generate the first defect discriminating signal 'fdtg1' in response to the internal clock signal 'clk_int'. The input command signal 'cmd_in' can include even numbers of bits having the first logic level in a compress test, and thus, it is normal when even numbers of bits of the first logic level belong to the latch command signal 'cmd_lat'. The first defect discriminating block 18 can discriminate whether or not the bits having the first logic level are even numbers and can generate the first defect discriminating signal 'fdtg1' in response to the internal clock 'signal clk_int'.

The first data output buffer 19 can buffer and transmit data transmitted through a data line (not shown) to the first data output pin 20 when the test mode signal 'tmd' is disabled. Conversely, the first data output buffer 19 can latch the first defect discriminating signal 'fdtg1' by using the internal clock signal 'clk_int', and can then buffer and transmit the latched first defect discriminating signal 'fdtg1' to the first data output pin 20.

Meanwhile, the second defect discriminating block 21 can discriminate whether or not the decoded address signal 'add_dcd' is defective and can generate the second defect discriminating signal 'fdtg2' in response to the command strobe signal 'cstb'. The input address signal 'add_in' can include the even numbers of bits having the first logic level. In response to this, the address decoding block 17 can generate the decoded address signal 'add_dcd' including the even numbers of bits of the first logic level. The second defect discriminating block 21 can discriminate whether or not the bits having the first logic level belonging to the decoded address signal 'add_dcd' are the even numbers and generates the second defect discriminating signal 'fdtg2' in response to the command strobe signal 'cstb'.

The first defect discriminating block 18 can discriminate whether or not the latch command signal 'cmd_lat' is defective and the second defect discriminating block 21 can discriminate whether or not the decoded address signal 'add_dcd' is defective.

The second data output buffer 22 can buffer the data transmitted through the data line (not shown) to transmit the buffered data to the second data output pin 23 when the test mode signal 'tmd' is disabled. Conversely, the second data output buffer 22 can latch the second defect discriminating signal 'fdtg2' by using the command strobe signal 'cstb' and can then buffer the second defect discriminating signal 'fdtg2' to transmit the buffered second defect discriminating signal 'fdtg2' to the second data output pin 23.

Accordingly, the semiconductor memory apparatus can be configured to perform a boundary scan test using a compress test mode for not input data, but for the input command signal 'cmd_in' or the input address signal 'add_in', and can allow a result of the test to be verified through the data output buffers and the data output pins. Accordingly, reliability can be improved for a command signal and an address signal while preventing a yield from being lowered by performing a test of input signals, such as the input command signal 'cmd_in' and the input address signal 'add_in' without installing an additional pin.

Figure 2:
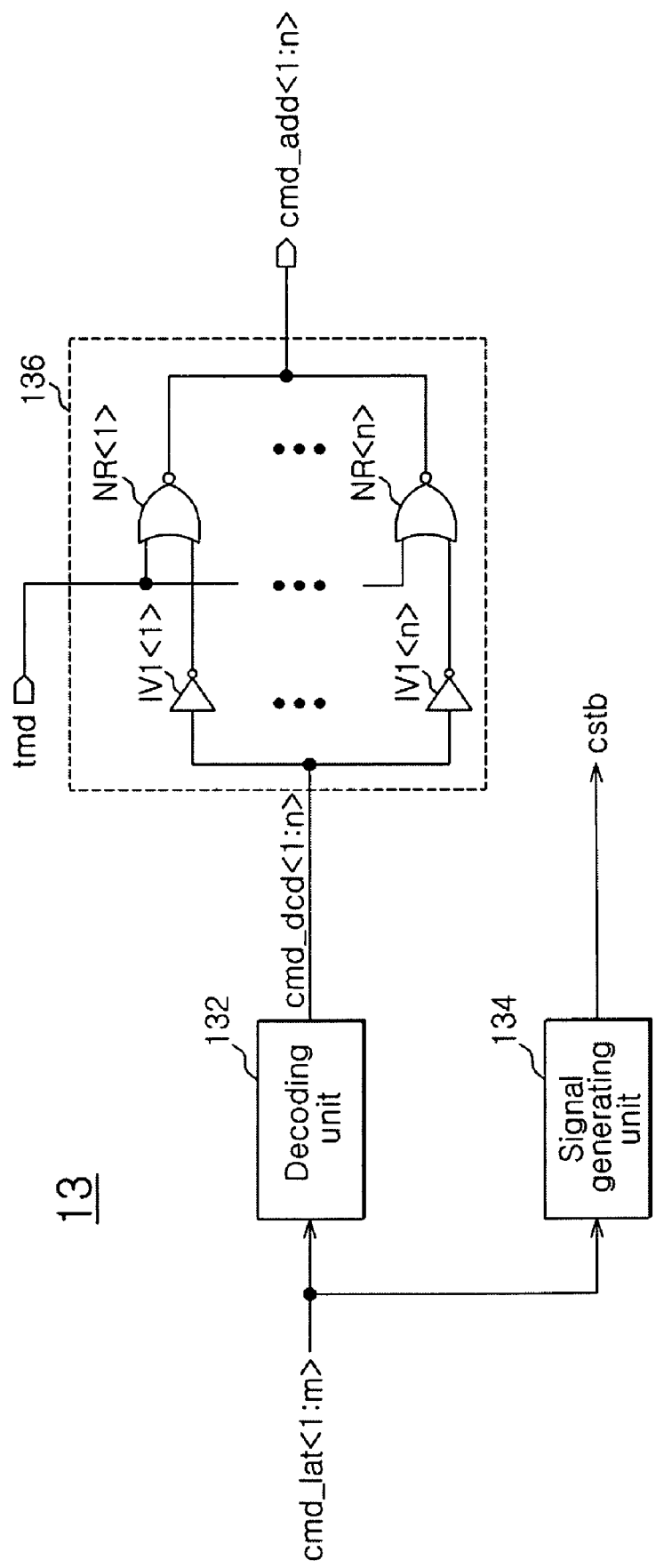
FIG. 2 is a schematic diagram of an exemplary configuration of a command decoding block that can be included in the apparatus of FIG. 1 according to one embodiment.

FIG. 2 is a schematic diagram of an exemplary configuration of a command decoding block of FIG. 1 according to one embodiment. For purposes of convention, the latch command is represented by an m bits of signal 'cmd_lat<1:m>' and the decoded command is represented by an n bits of signal 'cmd_dcd<1:n>'.

In FIG. 2, the command decoding block 13 can be configured to include a decoding unit 132, a signal generating unit 134, and a first switching unit 136. The decoding unit 132 can generate the decoded command signal 'cmd_dcd<1:n>' by decoding the latch command signal 'cmd_lat<1:m>'.

The signal generating unit 134 can generate the command strobe signal 'cstb' by using the latch command signal 'cmd_lat<1:m>'. The signal generating unit 134 can generate the command strobe signal 'cstb' by using any one bit belonging to the latch command signal 'cmd_lat<1:m>'. The command strobe signal 'cstb' can be implemented in a form of a pulse signal periodically generated in the compress test mode.

The first switching unit 136 can control output of the decoded command signal 'cmd_dcd<1:n>' in response to the test mode signal 'tmd'. Here, the first switching unit 136 can include an n-number of inverters IV1<1:n> and an n-number of NOR gates NR<1:n>, and can be configured by combining the test mode signal 'tmd' and the decoded command signal 'cmd_dcd<1:n>'

Accordingly, the command decoding block 13 can generate the decoded command signal 'cmd_dcd<1:n>' by decoding the latch command signal 'cmd_lat<1:m>'. For example, the command decoding block 13 can transmit the decoded command signal 'cmd_dcd<1:n>' to the core circuit area 14 if the test mode signal 'tmd' is disabled, while the command decoding block 13 can disable the core circuit area 14 to perform an unnecessary operation by blocking the output of the decoded command signal 'cmd_dcd<1:n>' if the test mode signal 'tmd' is enabled.

Figure 3A:
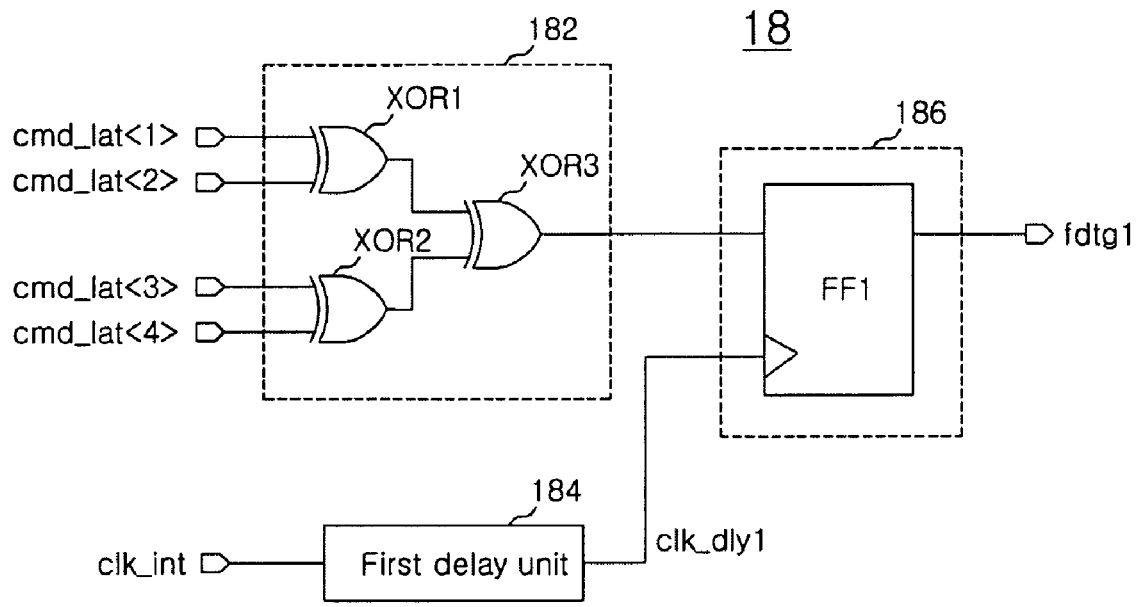
FIG. 3a is a schematic diagram of an exemplary configuration of a first defect discriminating block that can be included in the apparatus of FIG. 1 according to one embodiment.

FIG. 3a is a schematic diagram of an exemplary configuration of a first defect discriminating block of FIG. 1 according to one embodiment. For purposes of convention, it can be assumed that the latch command can also be implemented by a four bit signal 'cmd_lat<1:4>'.

In FIG. 3a, the first defect discriminating block 18 can be configured to include a first detection unit 182, a second delay unit 184, and a first latch unit 186.

The first detection unit 182 can detect whether or not the bits of the first logic level are even numbers in the latch command signal 'cmd_lat<1:4>'. The first detection unit 182 can be implemented by using first to third exclusive OR gates XOR1 to XOR3. For example, each of the first and second exclusive OR gates XOR1 and XOR2 can receive two bits of the latch command signal 'cmd_lat<1:4>', and the third exclusive OR gate XOR3 can receive output signals of the first and second exclusive OR gates XOR1 and XOR2. As a result, when the even numbers of bits of the first logic level are included in the latch command signal 'cmd_lat<1:4>', an output signal of the first detection unit 182 can be at a low level. Conversely, when odd numbers of bits of the first logic level are included in the latch command signal 'cmd_lat<1:4>', the output signal of the first detection unit 182 can be at the high level.

The first delay unit 184 can generate a first delay clock signal 'clk_dly1' by delaying the internal clock signal 'clk_int' by a predetermined time interval. The first delay unit 184 can allow the first latch unit 186 to perform a latching operation by reflecting a difference between a timing at which the command latching block 12 generates the latch command signal 'cmd_lat<1:4>' by using the internal clock signal 'clk_int' and a timing interval in which a signal is output from the first detection unit 182. The first delay unit 184 can be implemented by using a delay element.

The first latch unit 186 can output the first defect discriminating signal 'fdtg1' by latching the output signal of the first detection unit 182 in synchronization with the first delay clock signal 'clk_dly1'. The first latch unit 186 can be implemented by using a flip-flop FF1.

By this configuration, the first defect discriminating block 18 can output whether or not the even numbers of bits of the first logic level are included in the latch command signal 'cmd_lat<1:4>' through the first defect discriminating signal 'fdtg1'. When the odd numbers of bits of the first logic level are included in the latch command signal 'cmd_lat<1:4>' in the compress test mode, the level of the first defect discriminating signal 'fdtg1' can be shifted, thereby transmitting information that the input pint of the input command signal 'cmd_in' or the command latching block 12 has an error.

Figure 3B:
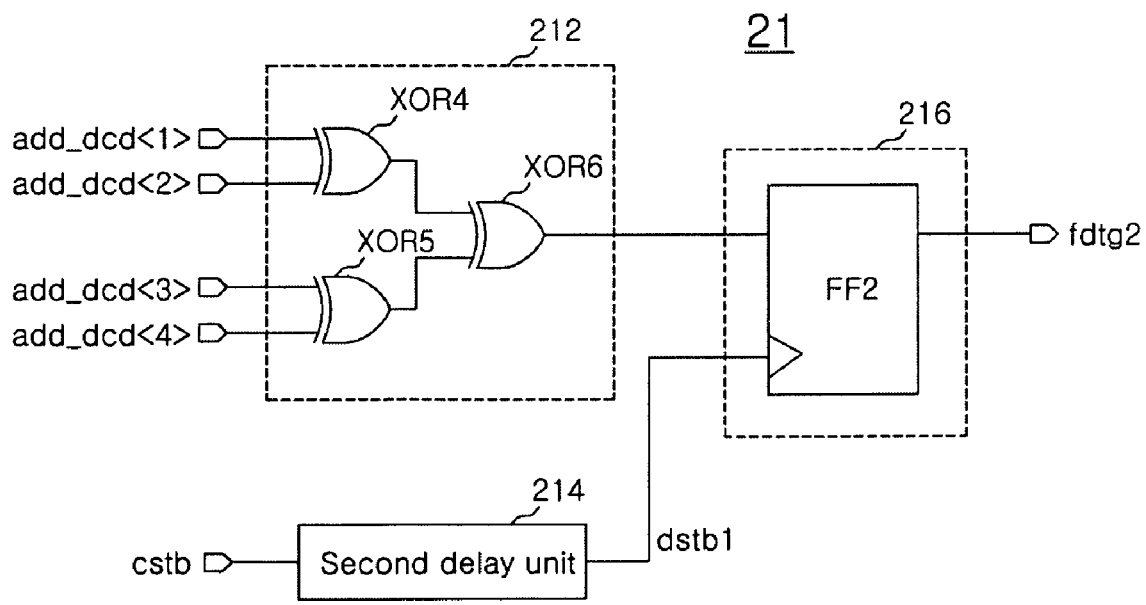
FIG. 3b is a schematic diagram of an exemplary configuration of a second defect discriminating block that can be included in the apparatus of FIG. 1 according to one embodiment.

FIG. 3b is a schematic diagram of an exemplary configuration of a second defect discriminating block of FIG. 1 according to one embodiment. For purposes of convention, it is exemplified that the decoded address can also be implemented by the four bits of signal 'add_dcd<1:4>'.

The configuration of the second defect discriminating block 21 can be substantially similar to that of the first defect discriminating block 18. For example, the second defect discriminating block 21 can include a second detection unit 212, a second delay unit 214, and a second latch unit 216. Here, the second detection unit 212 can receive the decoded address signal 'add_dcd<1:4>', the second delay unit 214 can generate a first delay strobe signal 'dstb1' by using the command strobe signal 'cstb', and the second latch unit 216 can output the second defect discriminating signal 'fdtg2'.

In FIG. 3b, the second detection unit 212 can include fourth to sixth exclusive OR gates XOR4 to XOR6, and the second latch unit 216 can include a flip-flop FF2. By this configuration, the second defect discriminating block 21 can output whether or not the even numbers of bits of the first logic level are included in the decoded address signal 'add_dcd<1:k>' through the second defect discriminating signal 'fdtg2'.

Figure 4A:
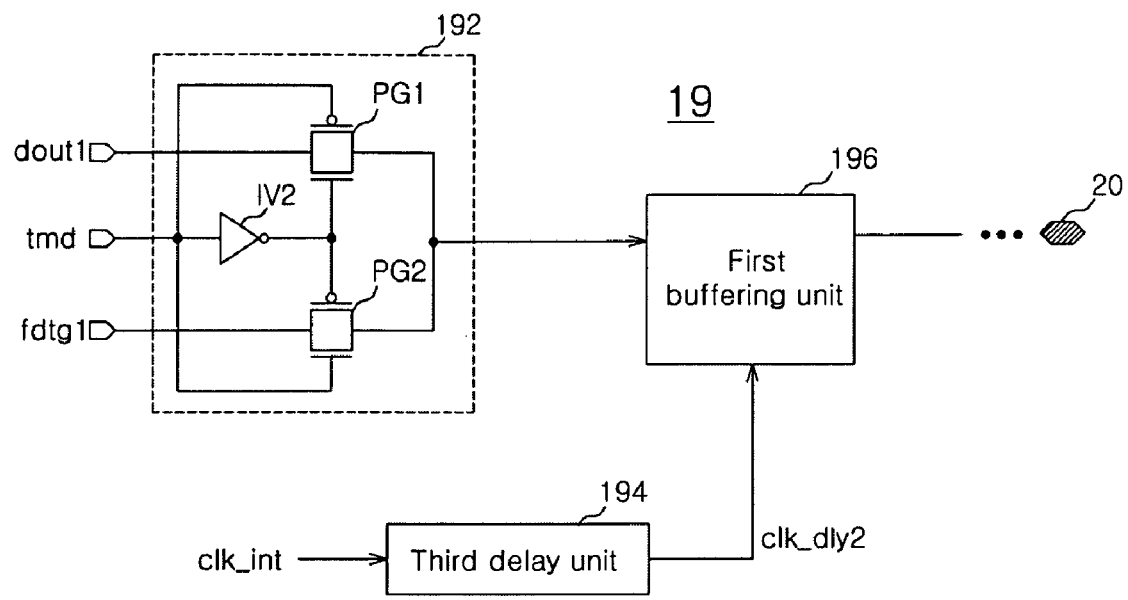
FIG. 4a is a schematic diagram of an exemplary configuration of a first data output buffer that can be included in the apparatus of FIG. 1 according to one embodiment.

FIG. 4a is a schematic diagram of an exemplary configuration of a first data output buffer of FIG. 1 according to one embodiment. In FIG. 4a, the first data output buffer 19 can be configured to include a second switching unit 192, a second delay unit 194, and a first buffering unit 196.

The second switching unit 192 can selectively pass the first defect discriminating signal 'fdtg1' or a first output data signal 'dout1' in response to the test mode signal 'tmd'. The second switching unit 192 can include an inverter IV2, a second pass gate PG1, and a second pass gate PG2. The inverter IV2 can receive the test mode signal 'tmd'. The first pass gate PG1 can pass the first output data signal 'dout1' in response to the test mode signal 'tmd' and an output signal of the inverter IV2. The second pass gate PG2 can pass the first defect discriminating signal 'fdtg1' in response to the output signal of the test mode signal and the output signal of the inverter IV2.

The third delay unit 194 can generate a second delay clock signal 'clk_dly2' by delaying the internal clock signal 'clk_int' by a predetermined time interval. The third delay unit 194 can allow the first buffering unit 196 to perform a buffering operation by reflecting a difference between a timing at which the first defect discriminating block 18 generates the first defect discriminating signal 'fdtg1' by using the internal clock signal 'clk_int' and a timing in which a signal is output from the second switching unit 192. The third delay unit 194 can be implemented by using a delay element.

The first buffering unit 196 can buffer an output signal of the second switching unit 192 in response to the second delay clock signal 'clk_dly2' to transmit the buffered output signal to the first data output pin 20. The first buffering unit 196 can be implemented by an output buffer. The first buffering unit 196 can buffer the first defect discriminating signal 'fdtg1' or the first output data signal 'dout1' transmitted from the second switching unit 192 in synchronization with the second delay clock signal 'clk_dly2', and then can transmit the buffered signal or data to the first data output pin 20.

By the configuration of the first data output buffer 19, since the first defect discriminating signal 'fdtg1' can be output through the first data output pin 20 in a test mode, it is possible to monitor a test result. After then, when the test mode is terminated, the first data output buffer 19 can perform a general operation of buffering and output the first output data signal 'dout1'.

Figure 4B:
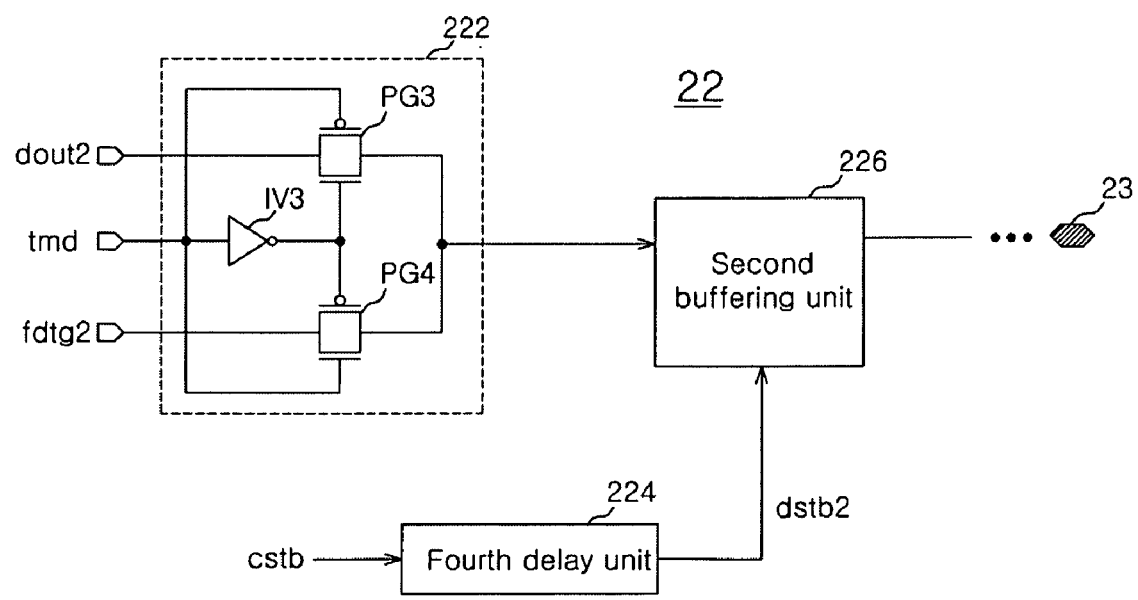
FIG. 4b is a schematic diagram of an exemplary configuration of a second data output buffer that can be included in the apparatus of FIG. 1 according to one embodiment.

FIG. 4b is a schematic diagram of an exemplary configuration of a second data output buffer of FIG. 1 according to one embodiment. In FIG. 4b, the second data output buffer 22 can have a configuration substantially similar to the first data output buffer 19. For example, the second data output buffer 22 can be configured to include a third switching unit 222, a fourth delay unit 224, and a second buffering unit 226. Here, the third switching unit 222 can include an inverter IV3, a third pass gate PG3, and a fourth pass gate PG4 to selectively pass the second defect discriminating signal 'fdtg2' or the second output data signal 'dout2' in response to the test mode signal 'tmd'. The fourth delay unit 224 can generate a second delay strobe signal 'dstb2' by using the command strobe signal 'cstb'. The second buffering unit 226 can have the form of am data output buffer to buffer an output signal of the third switching unit 22 in response to the second delay strobe signal 'dstb2', and then transmit the buffered output signal to the second data output pin 23. By this configuration, similarly to the first data output buffer 19, the second data output buffer 22 can also output the second defect discriminating signal 'fdtg2' through the second data output pin 23 in the test mode, thereby monitoring the test result.

FIG. 5 is a schematic diagram of an exemplary configuration of a semiconductor memory apparatus according to another embodiment. In FIG. 5, a semiconductor memory apparatus 101 can be configured to include a first defect discriminating block 18-1 that can discriminate whether or not all bits of a latch address signal 'add_lat' and a latch command signal 'cmd_lat' are defective. Although not shown, the first defect discriminating block 18-1 can include a plurality of exclusive OR gates. Accordingly, a first defect discriminating signal 'fdtg1' can be output to an exterior of the semiconductor memory apparatus 102 through a first data output buffer 19-1 and a first data output pin 20-1 that can contain information on whether or not all the bits of the latch address signal 'add_lat' and the latch command signal 'cmd_lat' are defective.

In addition, a circuit may be included in which only the latch address signal 'add_lat' is input into the first defect discriminating block 18-1 except for the latch command signal 'cmd_lat'. Accordingly, such a configuration may be implemented by adjusting the number of exclusive OR gates included in the first discriminating block 18-1. Thus, it is possible to execute only a test for discriminating whether or not an input circuit of an address is defective.

As described above, a semiconductor memory apparatus can perform a boundary scan test for an input signal, such as an address signal or a command signal. For example, the semiconductor memory apparatus can discriminate whether or not the address signal or the command signal is normally latched after inputting the address signal or the command signal and can output the latched address signal or command signal through a data output buffer and a data output pin, thereby allowing a result of the test to be monitored from an exterior of the semiconductor memory apparatus. Accordingly, since an existing pin is used, the requirement for an additional pin is unnecessary. Thus, the semiconductor memory apparatus has an advantage in that it is possible to improve productivity by enhancing the reliability of the input signal without lowering the yield in a wafer state.

While certain embodiments have been described above, it will be understood that the embodiments described are by way of example only. Accordingly, the device and method described herein should not be limited based on the described embodiments. Rather, the devices and methods described herein should only be limited in light of the claims that follow when taken in conjunction with the above description and accompanying drawings.

What is claimed is:

1. A semiconductor memory apparatus, comprising:
an input buffering block configured to buffer an input signal transmitted from an input pin;
a latch block configured to latch the input signal buffered by the input buffering block;
a defect discriminating block configured to discriminate whether or not the input signal latched by the latch block is defective signal in response to a test mode signal; and
a data output buffer configured to buffer an output signal of the defect discriminating block to transmit it to a data output pin,
wherein the input signal is one of an input command signal and an input address signal.

2. The semiconductor memory apparatus of claim 1, wherein the input command signal and the input address signal latched by the latch block are implemented by plural bits of signals, and the defect discriminating block is configured to discriminate whether or not even numbers of bits of a first logic level are included in the latched input signal to output a discrimination result through the output signal.

3. The semiconductor memory apparatus of claim 1, wherein the data output buffer is configured to buffer an output data to transmit the output buffer to the data output pin when the test mode signal is disabled, while the data output buffer is configured to buffer the output signal of the defect discriminating block to transmit the buffered output signal of the defect discriminating block to the data output pin when the test mode signal is enabled.

4. The semiconductor memory apparatus of claim 1, further comprising a decoding block configured to decode the input signal latched by the latching block and to control output of the decoded input signal to a core circuit area in response to the test mode signal.

5. The semiconductor memory apparatus of claim 1, wherein the test mode signal is a signal enabled during a boundary scan test using a compress test mode.

6. A semiconductor memory apparatus, comprising:
a first defect discriminating block configured to discriminate whether or not a command signal transmitted from a first input pin and latched is defective to generate a first defect discriminating signal in response to a test mode signal;
a first data output buffer configured to buffer the first defect discriminating signal to transmit the buffered first defect discriminating signal to a first data output pin;
a decoding block configured to generate a decoded command signal and a decoded address signal by decoding the latched command signal and an address signal transmitted from a second input pin and latched, to control output of the decoded command signal and the decoded address signal to a core circuit area in response to the test mode signal;
a second defect discriminating block configured to discriminate whether or not the decoded address signal is defective to generate a second defect discriminating block signal; and
a second data output buffer configured to buffer the second defect discriminating signal to transmit the buffered second defect discriminating signal to a second data output pin.

7. The semiconductor memory apparatus of claim 6, wherein the latched command signal is implemented by plural bits of signal, and the first defect discriminating block is configured to discriminate whether or not even numbers of bits of a first logic level are included in the latched command signal to output a discrimination result through the first defect discriminating signal.

8. The semiconductor memory apparatus of claim 6, wherein the first data output buffer is configured to buffer an output data signal to transmit the buffered output data signal to the first data output pin when the test mode signal is disabled, while the first data output buffer is configured to buffer the first defect discriminating signal to transmit the buffered first defect discriminating signal to the first data output pin when the test mode signal is enabled.

9. The semiconductor memory apparatus of claim 6, wherein the decoding block comprises:
a command decoding block configured to generate a decoded command signal and a command strobe signal by decoding the latched command signal and to control the output of the decoded command signal to the core circuit area in response to the test mode signal; and
an address decoding block configured to generate a decoded address signal by decoding the latched address signal to output the decoded address signal to the core circuit area.

10. The semiconductor memory apparatus according to claim 9, wherein the command decoding block is configured to transmit the decoded command signal to the core circuit area when the test mode signal is disabled and to block the output of the decoded command signal when the test mode signal is enabled.

11. The semiconductor memory apparatus according to claim 9, wherein the latched address signal is implemented by plural bits of signal, and the second defect discriminating block is configured to discriminate whether or not the even numbers of bits of the first logic level are included in the latched address signal to output a discrimination result through the second defect discriminating signal.

12. The semiconductor memory apparatus according to claim 9, wherein the second data output buffer is configured to buffer the output data signal to transmit the buffered output data signal to the second data output pin when the test mode signal is disabled, while the second data output buffer is configured to buffer the second defect discriminating signal to transmit the buffered second defect discriminating signal to the second data output pin when the test mode signal is enabled.

13. The semiconductor memory apparatus according to claim 6, wherein the test mode signal is a signal enabled during a boundary scan test using a compress test mode.

14. A semiconductor memory apparatus, comprising:
a command decoding block configured to generate a decoded command signal and a command strobe signal by using a command signal transmitted from a first input pin and latched in response to a test mode signal;
an address decoding block configured to generate a decoded address signal by using an address signal transmitted from a second input pin and latched in response to the command strobe signal;
a defect discriminating block configured to discriminate whether or not the decoded address signal is defective to generate a defect discriminating signal in response to the test mode signal; and
a data output buffer configured to buffer the defect discriminating signal to transmit the buffered defect discriminating signal to a data output pin.

15. The semiconductor memory apparatus of claim 14, wherein the command decoding block is configured to transmit the decoded command signal to a core circuit area when the test mode signal is disabled, while the command decoding block is configured to block output of the decoded command signal when the test mode signal is enabled.

16. The semiconductor memory apparatus of claim 14, wherein the latched address signal is implemented by plural bits of signal, and the defect discriminating block is configured to discriminate whether or not even numbers of bits of a first logic level are included in the latched address signal to output a discrimination result through the defect discriminating signal.

17. The semiconductor memory apparatus of claim 14, wherein the data output buffer is configured to buffer an output data signal to transmit the buffered output data signal to the data output pin when the test mode signal is disabled, while the data output buffer is configured to buffer the defect discriminating signal to transmit the buffered defect discriminating signal to the data output pin when the test mode signal is enabled.

18. The semiconductor memory apparatus of claim 14, wherein the test mode signal is a signal enabled during a boundary scan test using a compress test mode.

* * * * *